(12) United States Patent
Wei

(10) Patent No.: US 12,355,350 B2
(45) Date of Patent: Jul. 8, 2025

(54) POWER SWITCH CIRCUIT

(71) Applicant: ANPEC ELECTRONICS CORPORATION, Hsinchu (TW)

(72) Inventor: Shih-Chung Wei, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 223 days.

(21) Appl. No.: 18/459,002

(22) Filed: Aug. 30, 2023

(65) Prior Publication Data
US 2025/0007401 A1 Jan. 2, 2025

(30) Foreign Application Priority Data

Jun. 27, 2023 (TW) ................. 112123769

(51) Int. Cl.
*H02M 3/156* (2006.01)
*H02M 1/32* (2007.01)
*H03K 17/082* (2006.01)

(52) U.S. Cl.
CPC ............. *H02M 3/156* (2013.01); *H02M 1/32* (2013.01); *H03K 17/082* (2013.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081;
(Continued)

(56) References Cited

U.S. PATENT DOCUMENTS 7,986,499 B2 * 7/2011 Wang .................. G05F 3/262
361/18
10,547,171 B2 * 1/2020 Mirabella .......... H03K 17/0822
(Continued)

FOREIGN PATENT DOCUMENTS

TW 200623590 A 7/2006
TW 202010213 A 3/2020

*Primary Examiner* — Jeffrey A Gblende
(74) *Attorney, Agent, or Firm* — Li & Cai Intellectual Property Office

(57) ABSTRACT

A power switch circuit of adaptively limiting a current is provided. The power switch circuit includes a current sensing resistor, a power switch, a charge pump and an adaptive current limiting circuit. A first terminal of the current sensing resistor is coupled to an input voltage. A first terminal of the power switch is connected to a second terminal of the current sensing resistor. A second terminal of the power switch is connected to a first terminal of a capacitor. A second terminal of the capacitor is grounded. An output terminal of the charge pump is connected to a control terminal of the power switch. According to the input voltage, a voltage of the current sensing resistor and a voltage of the capacitor, the adaptive current limiting circuit determines whether to control an operation of the power switch for limiting the current flowing through the power switch.

16 Claims, 7 Drawing Sheets

(58) Field of Classification Search
CPC .......... H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H02M 1/0009; H02M 1/08; H02M 1/088; H02M 1/0048; H05B 39/048; B23K 11/24; H04B 2215/069
See application file for complete search history.

(56) References Cited

U.S. PATENT DOCUMENTS

| | | | |
|---|---|---|---|
| 11,703,898 B2* | 7/2023 | Georgievski | G05F 1/575 |
| | | | 323/266 |
| 2006/0082407 A1 | 4/2006 | Simonson | |
| 2020/0052500 A1 | 2/2020 | Chen | |
| 2024/0288893 A1* | 8/2024 | Kamagond | H02M 3/155 |

* cited by examiner

POWER SWITCH CIRCUIT

CROSS-REFERENCE TO RELATED PATENT APPLICATION

This application claims the benefit of priority to Taiwan Patent Application No. 112123769, filed on Jun. 27, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power switch circuit, and more particularly to a power switch circuit for adaptively limiting a current.

BACKGROUND OF THE DISCLOSURE

With the progress and development of science and technology, electronic devices are more and more widely used in homes and offices, and have become an indispensable part of people's daily lives. A conventional current limiting circuit of a power switch of the electronic device sets a constant current limit value. When an input current of the power switch reaches the constant current limit value, the conventional current limiting circuit clamps the input current of the power switch at the constant current limit value. At this time, if a load continually obtains a large amount of power through the power switch, an output voltage of the power switch is continually reduced. When the output voltage of the power switch is reduced to be lower than a voltage threshold such as 0V, a substrate current generated by impact ionization of hot carriers inside the power switch is gradually increased to a maximum value. When the substrate current is increased such that a voltage across a base terminal and an emitter terminal of the power switch's intrinsic device is increased to about 0.7V, the power switch such as a low-voltage NMOS transistor is damaged.

SUMMARY OF THE DISCLOSURE

In response to the above-referenced technical inadequacies, the present disclosure provides a power switch circuit of adaptively limiting a current. The power switch circuit includes a current sensing resistor, a power switch, a charge pump and an adaptive current limiting circuit. A first terminal of the current sensing resistor is coupled to an input voltage. A first terminal of the power switch is connected to a second terminal of the current sensing resistor. A second terminal of the power switch is connected to a first terminal of an output capacitor. A second terminal of the output capacitor is grounded. A voltage of the first terminal of the output capacitor is an output voltage of the power switch circuit. The charge pump is connected to a control terminal of the power switch. The charge pump is configured to supply power to the control terminal of the power switch. The adaptive current limiting circuit is coupled to the input voltage. The adaptive current limiting circuit is connected to the first terminal of the output capacitor, the second terminal of the current sensing resistor and the control terminal of the power switch. The adaptive current limiting circuit determines whether to output a current limiting signal to the control terminal of the power switch according to the input voltage, a voltage of the second terminal of the current sensing resistor and a voltage of the first terminal of the output capacitor. The power switch operates to limit a current flowing through the power switch according to the current limiting signal from the adaptive current limiting circuit.

In the embodiments, the power switch circuit further includes an oscillator circuit. The oscillator circuit is connected to the charge pump and configured to output an oscillating signal to the charge pump. The charge pump determines a frequency of supplying power to the control terminal of the power switch according to a frequency of the oscillating signal from the oscillator circuit.

In the embodiments, the adaptive current limiting circuit includes a current limit adjusting circuit and a current limit controlling circuit. The current limit adjusting circuit is coupled to the input voltage and connected to the first terminal of the output capacitor. The current limit adjusting circuit is configured to detect the input voltage and the voltage of the first terminal of the output capacitor to output a current adjusting signal. The current limit controlling circuit is connected to an output terminal of the current limit adjusting circuit, the second terminal of the current sensing resistor and the control terminal of the power switch. The current limit controlling circuit is configured to output a current limit controlling signal to the control terminal of the power switch, according to a voltage of the current adjusting signal from the current limit adjusting circuit and the voltage of the second terminal of the current sensing resistor.

In the embodiments, the current limit adjusting circuit includes a first operational amplifier, a comparator, a first current mirror circuit, a switching component and a second current mirror circuit. A first input terminal of the first operational amplifier is connected to a voltage source. The voltage source is coupled to the input voltage. A second input terminal of the first operational amplifier is connected to an output terminal of the first operational amplifier and a first terminal of a first resistor. A first input terminal of the comparator is coupled to a limit voltage. A second input terminal of the comparator and a second terminal of the first resistor are connected to the first terminal of the output capacitor. An input terminal of the first current mirror circuit is connected to the output terminal of the first operational amplifier. A first terminal of the switching component is connected to an output terminal of the first current mirror circuit. A control terminal of the switching component is connected to an output terminal of the comparator. An input terminal of the second current mirror circuit is connected to a second terminal of the switching component. An output terminal of the second current mirror circuit is connected to an input terminal of the current limit controlling circuit.

In the embodiments, the current limit controlling circuit includes a third current mirror circuit, a second operational amplifier and a current limit switch. An input terminal of the third current mirror circuit is connected to the output terminal of the second current mirror circuit and an output terminal of a current source. An input terminal of the third current mirror circuit is coupled to the input voltage. A first input terminal of the second operational amplifier is connected to an output terminal of the third current mirror circuit. A second input terminal of the second operational amplifier is connected to the second terminal of the current sensing resistor. A control terminal of the current limit switch is connected to an output terminal of the second operational amplifier. A first terminal of the current limit switch is connected to the control terminal of the power switch. A second terminal of the current limit switch is grounded.

In the embodiments, the first current mirror circuit includes a first transistor and a second transistor. A first terminal of the first transistor is coupled to the input voltage. A second terminal of the first transistor is connected to the output terminal of the first operational amplifier and a control terminal of the first transistor. A first terminal of the second transistor is coupled to the input voltage. A control terminal of the second transistor is connected to the control terminal of the first transistor. A second terminal of the second transistor is connected to the first terminal of the switching component.

In the embodiments, the second current mirror circuit includes a third transistor and a fourth transistor. A first terminal of the third transistor is connected to the second terminal of the switching component and a control terminal of the third transistor. A second terminal of the third transistor is grounded. A first terminal of the fourth transistor is connected to an output terminal of the current source. A control terminal of the fourth transistor is connected to the control terminal of the third transistor. A second terminal of the fourth transistor is grounded.

In the embodiments, the third current mirror circuit includes a fifth transistor and a sixth transistor. A first terminal of the fifth transistor is connected to a first terminal of the fourth transistor and the output terminal of the current source. A second terminal of the fifth transistor is grounded. A control terminal of the sixth transistor is connected to a control terminal and the first terminal of the fifth transistor. A first terminal of the sixth transistor is connected to the first input terminal of the second operational amplifier. A second terminal of the sixth transistor is grounded.

In the embodiments, the current limit controlling circuit further includes a second resistor. A first terminal of the second resistor is coupled to the input voltage. A second terminal of the second resistor is connected to the first terminal of the sixth transistor and the first input terminal of the second operational amplifier.

In the embodiments, the adaptive current limiting circuit includes a plurality of current limit adjusting circuits and a current limit controlling circuit. The plurality of current limit adjusting circuits are coupled to the input voltage and connected to the first terminal of the output capacitor. The current limit adjusting circuits are configured to detect the input voltage and the voltage of the first terminal of the output capacitor for outputting current adjusting signals, respectively. The current limit controlling circuit is connected to an output terminal of each of the plurality of current limit adjusting circuits, the second terminal of the current sensing resistor and the control terminal of the power switch. The current limit controlling circuit, according to differences between a plurality of current adjusting signals outputted respectively by the plurality of current limit adjusting circuits and the voltage of the second terminal of the current sensing resistor, outputs a plurality of current limit controlling signals to the control terminal of the power switch in a multi-stage current limiting operation for reducing the current flowing through the power switch multiple times.

In the embodiments, each of the plurality of current limit adjusting circuits includes a first operational amplifier, a comparator, a first current mirror circuit, a switching component and a second current mirror circuit. A first input terminal of the first operational amplifier is connected to a voltage source. The voltage source is coupled to the input voltage. A second input terminal of the first operational amplifier is connected to an output terminal of the first operational amplifier and a first terminal of a first resistor. A first input terminal of the comparator is coupled to a limit voltage. A second input terminal of the comparator and a second terminal of the first resistor are connected to the first terminal of the output capacitor. An input terminal of the first current mirror circuit is connected to the output terminal of the first operational amplifier. A first terminal of the switching component is connected to an output terminal of the first current mirror circuit. A control terminal of the switching component is connected to an output terminal of the comparator. An input terminal of the second current mirror circuit is connected to a second terminal of the switching component. An output terminal of the second current mirror circuit is connected to an input terminal of the current limit controlling circuit.

In the embodiments, the current limit controlling circuit includes a third current mirror circuit, a second operational amplifier and a current limit switch. An input terminal of the third current mirror circuit is connected to the output terminal of the second current mirror circuit and an output terminal of a current source. An input terminal of the third current mirror circuit is coupled to the input voltage. A first input terminal of the second operational amplifier is connected to an output terminal of the third current mirror circuit. A second input terminal of the second operational amplifier is connected to the second terminal of the current sensing resistor. A control terminal of the current limit switch is connected to an output terminal of the second operational amplifier. A first terminal of the current limit switch is connected to the control terminal of the power switch. A second terminal of the current limit switch is grounded.

In the embodiments, the first current mirror circuit includes a first transistor and a second transistor. A first terminal of the first transistor is coupled to the input voltage. A second terminal of the first transistor is connected to the output terminal of the first operational amplifier and a control terminal of the first transistor. A first terminal of the second transistor is coupled to the input voltage. A control terminal of the second transistor is connected to the control terminal of the first transistor. A second terminal of the second transistor is connected to the first terminal of the switching component.

In the embodiments, the second current mirror circuit includes a third transistor and a fourth transistor. A first terminal of the third transistor is connected to the second terminal of the switching component and a control terminal of the third transistor. A second terminal of the third transistor is grounded. A first terminal of the fourth transistor is connected to an output terminal of the current source. A control terminal of the fourth transistor is connected to a control terminal of the third transistor. A second terminal of the fourth transistor is grounded.

In the embodiments, the third current mirror circuit includes a fifth transistor and a sixth transistor. A first terminal of the fifth transistor is connected to a first terminal of the fourth transistor and the output terminal of the current source. A second terminal of the fifth transistor is grounded. A control terminal of the sixth transistor is connected to a control terminal and the first terminal of the fifth transistor. A first terminal of the sixth transistor is connected to the first input terminal of the second operational amplifier. A second terminal of the sixth transistor is grounded.

In the embodiments, the current limit controlling circuit further includes a second resistor. A first terminal of the second resistor is coupled to the input voltage. A second terminal of the second resistor is connected to the first terminal of the sixth transistor and the first input terminal of the second operational amplifier.

As described above, the present disclosure provides the power switch circuit of adaptively limiting the current. In the power switch circuit of the present disclosure, the adaptive current limiting circuit flexibly determines a current limit value for limiting the current flowing through the power switch based on the input voltage and output voltage of the power switch, rather than using a constant current limit. Therefore, the power switch of the power switch circuit of the present disclosure is prevented from being damaged under any condition, for example, under a condition where there is a low output voltage and a high input voltage, which may cause a short circuit.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
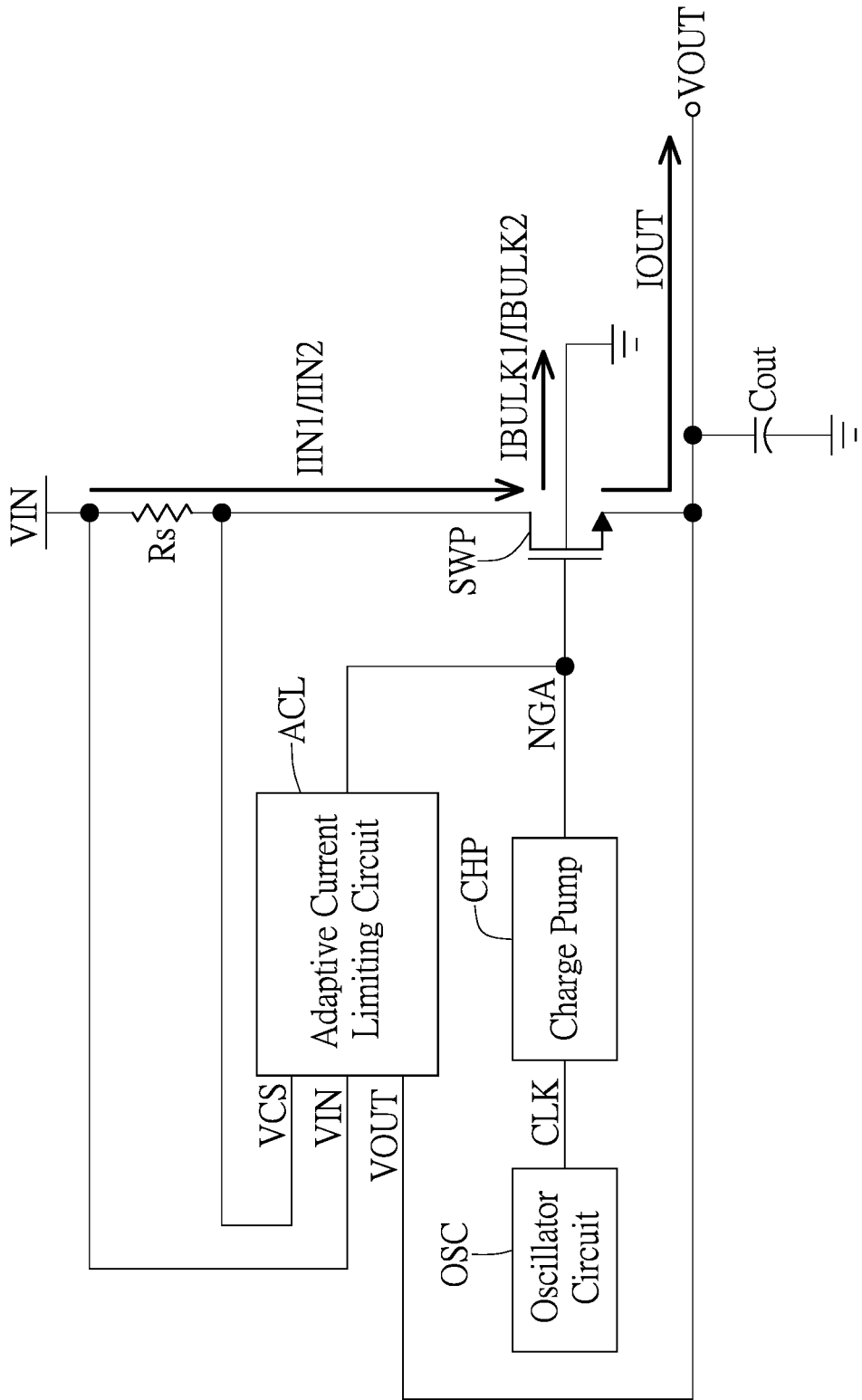
FIG. 1 is a circuit diagram of a power switch circuit of adaptively limiting a current according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a circuit diagram of a power switch circuit of adaptively limiting a current according to a first embodiment of the present disclosure.

The power switch circuit of the first embodiment of the present disclosure includes a current sensing resistor Rs, a power switch SWP, a charge pump CHP and an adaptive current limiting circuit ACL.

A first terminal of the current sensing resistor Rs is coupled to an input voltage VIN. A first terminal of the power switch SWP is connected to a second terminal of the current sensing resistor Rs. A second terminal of the power switch SWP is connected to a first terminal of an output capacitor Cout. A second terminal of the output capacitor Cout is grounded. The first terminal of the output capacitor Cout or the second terminal of the power switch SWP may be used as an output terminal of the power switch circuit of the present disclosure. The output terminal of the power switch circuit of the present disclosure is connected to a load. A voltage of the first terminal of the output capacitor Cout or the second terminal of the power switch SWP is used as an output voltage VOUT of the power switch circuit of the present disclosure.

The charge pump CHP is connected to a control terminal NGA of the power switch SWP. The charge pump CHP is configured to supply power to the control terminal NGA of the power switch SWP.

If necessary, the power switch circuit of the present disclosure may further include an oscillator circuit OSC. The oscillator circuit OSC is connected to the charge pump CHP. The oscillator circuit OSC may output an oscillating signal CLK to the charge pump CHP. The charge pump CHP determines a frequency of supplying power to the control terminal NGA of the power switch SWP according to a frequency of the oscillating signal CLK from the oscillator circuit OSC.

It is worth noting that, the adaptive current limiting circuit ACL of the power switch circuit of the present disclosure is coupled to the input voltage VIN. The adaptive current limiting circuit ACL of the power switch circuit of the present disclosure is connected to the first terminal of the output capacitor Cout or the second terminal of the power switch SWP, the second terminal of the current sensing resistor Rs and the control terminal NGA of the power switch SWP.

The adaptive current limiting circuit ACL of the power switch circuit of the present disclosure determines whether to output a current limiting signal to the control terminal NGA of the power switch SWP, according to the input voltage VIN, a voltage of the second terminal of the current sensing resistor Rs (that is a sensed voltage VCS as shown in FIG. 1), and the voltage of the first terminal of the output capacitor Cout or the second terminal of the power switch SWP (that is the output voltage VOUT of the power switch circuit of the present disclosure). The power switch SWP operates to limit an input current IIN1 or IIN2 flowing through the power switch SWP according to the current limiting signal from the adaptive current limiting circuit ACL.

As a result, the adaptive current limiting circuit ACL of the power switch circuit of the present disclosure limits a substrate current IBULK1 or IBULK2 generated by impact ionization of hot carriers inside the power switch SWP to be not larger than a current limit value, thereby preventing the power switch SWP from being damaged due to overcurrent. At the same time, an output current IOUT supplied to the load by the power switch circuit of the present disclosure is limited.

Figure 2:
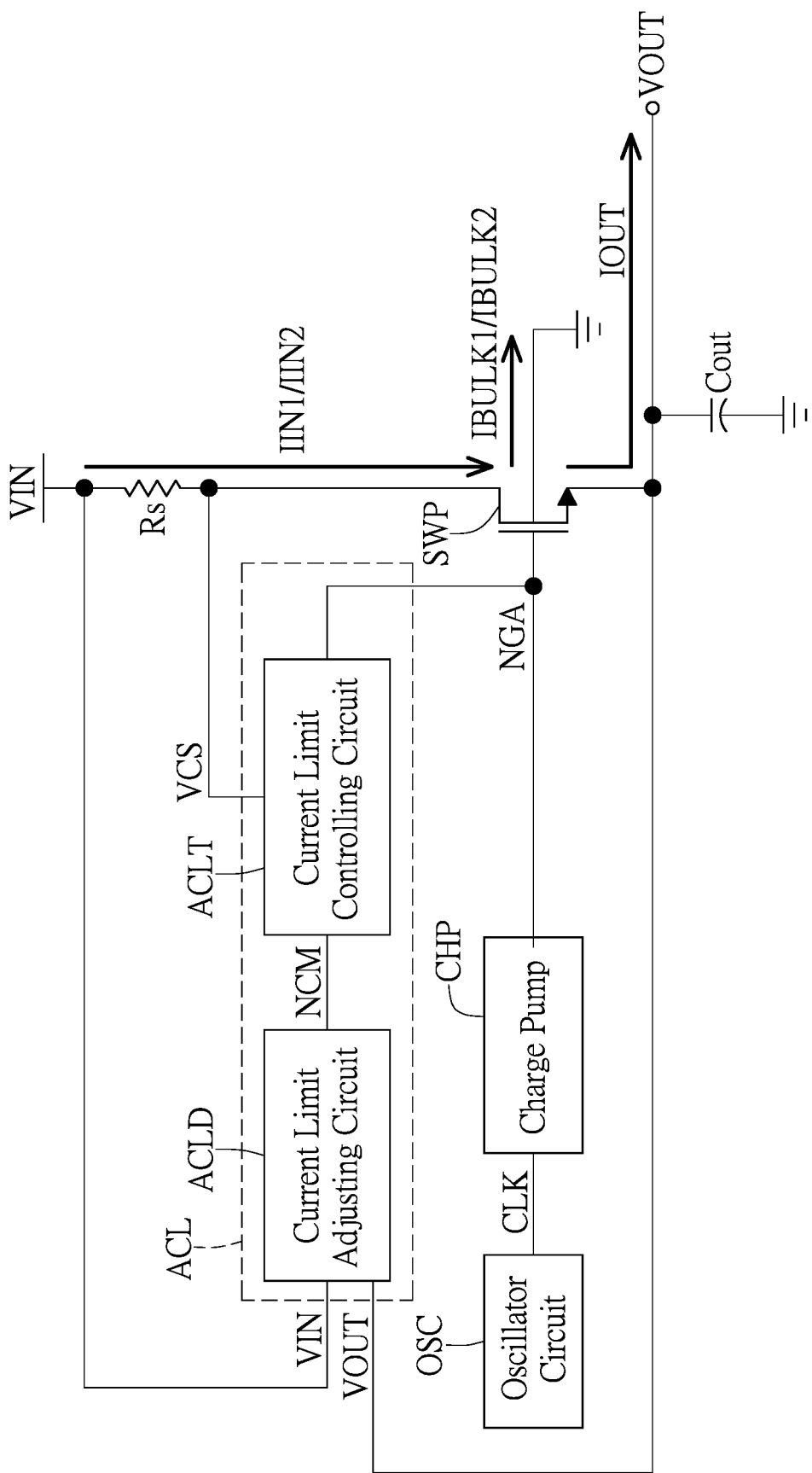
FIG. 2 is a circuit diagram of a power switch circuit of adaptively limiting a current according to a second embodiment of the present disclosure.

Reference is made to FIG. 2, which is a circuit diagram of a power switch circuit of adaptively limiting a current according to a second embodiment of the present disclosure. The descriptions of the second embodiment of the present disclosure that are the same as that of the first embodiment of the present disclosure are not repeated herein.

In the second embodiment, the adaptive current limiting circuit ACL of the power switch circuit of the present disclosure includes a current limit adjusting circuit ACLD and a current limit controlling circuit ACLT.

The current limit adjusting circuit ACLD is coupled to the input voltage VIN, and is connected to the first terminal of the output capacitor Cout or the second terminal of the power switch SWP. The current limit controlling circuit ACLT is connected to an output terminal of the current limit adjusting circuit ACLD, the second terminal of the current sensing resistor Rs and the control terminal NGA of the power switch SWP.

The current limit adjusting circuit ACLD of the adaptive current limiting circuit ACL detects the input voltage VIN, and the voltage of the first terminal of the output capacitor Cout or the second terminal of the power switch SWP (that is the output voltage VOUT of the power switch circuit), to output the current adjusting signal to the current limit controlling circuit ACLT.

The current limit controlling circuit ACLT of the adaptive current limiting circuit ACL outputs a current limit controlling signal to the control terminal NGA of the power switch SWP for controlling an operation of the power switch SWP, according to a gain multiplied by a difference between the sensed voltage VCS of the second terminal of the current sensing resistor Rs and a voltage indicated by the current adjusting signal from the current limit adjusting circuit ACLD. As a result, the power switch SWP is prevented from being damaged by the large substrate current IBULK1 or IBULK2 generated by the impact ionization of the hot carriers inside the power switch SWP. At the same time, the output current IOUT supplied to the load by the power switch circuit of the present disclosure is limited.

Figure 3:
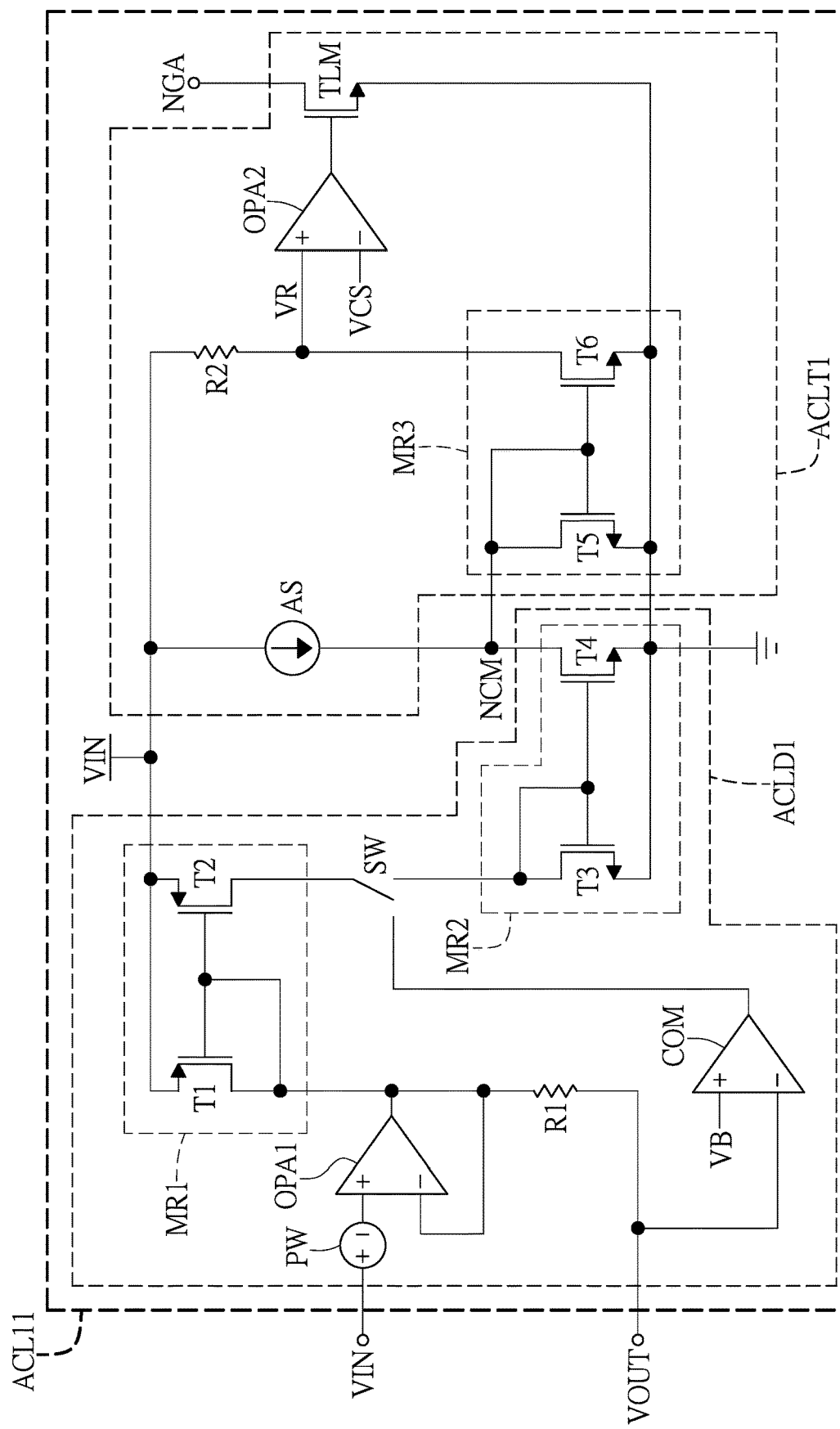
FIG. 3 is a circuit diagram of an adaptive current limiting circuit for performing a single stage current limiting operation in a power switch circuit of adaptively limiting a current according to a third embodiment of the present disclosure.
Figure 4:
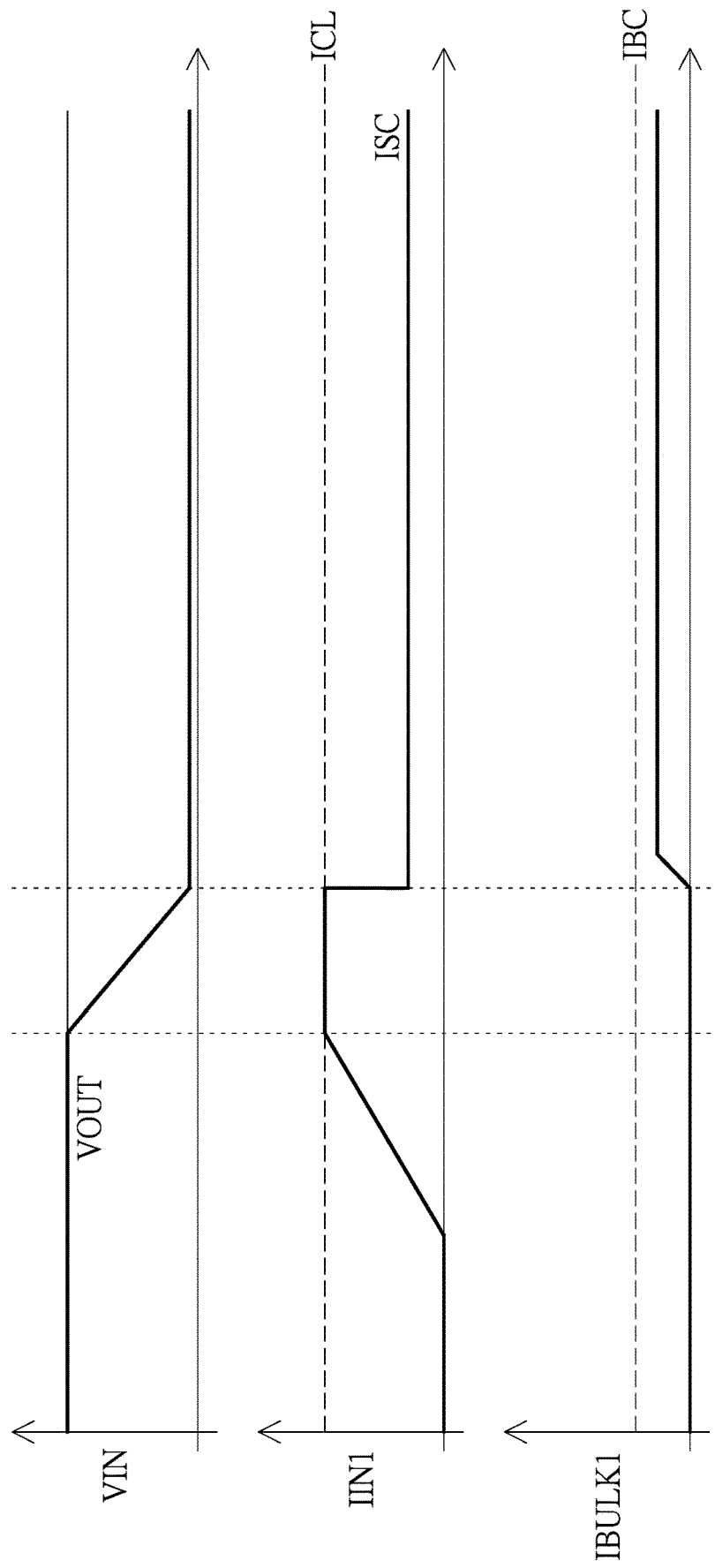
FIG. 4 is a waveform diagram of signals generated when the power switch circuit performs the single stage current limiting operation according to the third embodiment of the present disclosure.

Reference is made to FIGS. 3 and 4, in which FIG. 3 is a circuit diagram of an adaptive current limiting circuit for performing a single stage current limiting operation in a power switch circuit of adaptively limiting a current according to a third embodiment of the present disclosure, and FIG. 4 is a waveform diagram of signals generated when the power switch circuit performs the single stage current limiting operation according to the third embodiment of the present disclosure.

The adaptive current limiting circuit of the power switch circuit of the present disclosure such as the adaptive current limiting circuit ACL as shown in FIG. 1 or FIG. 2 may be the same as an adaptive current limiting circuit ACL11 as shown in FIG. 3.

As shown in FIG. 3, the adaptive current limiting circuit ACL11 may include a current limit adjusting circuit ACLD1 and a current limit controlling circuit ACLT1. The current limit adjusting circuit ACLD as shown in FIG. 2 may be the same as the current limit adjusting circuit ACLD1 as shown in FIG. 3, and the current limit controlling circuit ACLT as shown in FIG. 2 may be the same as the current limit controlling circuit ACLT1 as shown in FIG. 3.

As shown in FIG. 3, the current limit adjusting circuit ACLD1 includes a first operational amplifier OPA1, a comparator COM, a first current mirror circuit MR1, a switching component SW, a second current mirror circuit MR2 and a first resistor R1. The current limit controlling circuit ACLT1 includes a current source AS, a third current mirror circuit MR3, a second operational amplifier OPA2 and a current limit switch TLM.

A first input terminal such as a non-inverting input terminal of the first operational amplifier OPA1 is connected to a voltage source PW. The voltage source PW is coupled to the input voltage VIN. The voltage source PW provides a supply voltage such that a voltage difference is between the first input terminal such as the non-inverting input terminal of the first operational amplifier OPA1 and the input voltage VIN.

A second input terminal such as an inverting input terminal of the first operational amplifier OPA1 is connected to an output terminal of the first operational amplifier OPA1 and the first terminal of the first resistor R1.

A first input terminal such as a non-inverting input terminal of the comparator COM is coupled to a limit voltage VB. A second input terminal such as an inverting input terminal of the comparator COM is connected to a second terminal of the first resistor R1. A second input terminal such as an inverting input terminal of the comparator COM is coupled to the output voltage VOUT of the power switch circuit. In other words, the second input terminal such as the inverting input terminal of the comparator COM as shown in FIG. 3 is connected to the first terminal of the output capacitor Cout or the second terminal of the power switch SWP (that is the output terminal of the power switch circuit of the present disclosure) as shown in FIG. 1 or FIG. 2.

The first current mirror circuit MR1 may include a first transistor T1 and a second transistor T2.

A first terminal of the first transistor T1 and a first terminal of the second transistor T2 are coupled to the input voltage VIN. A second terminal of the first transistor T1 (that is an input terminal of the first current mirror circuit MR1) is connected to the output terminal of the first operational amplifier OPA1 and a control terminal of the first transistor T1. A control terminal of the second transistor T2 is connected to the control terminal of the first transistor T1. A second terminal of the second transistor T2 (that is an output terminal of the first current mirror circuit MR1) is connected to a first terminal of the switching component SW. A control terminal of the switching component SW is connected to an output terminal of the comparator COM.

The second current mirror circuit MR2 includes a third transistor T3 and a fourth transistor T4.

A first terminal of the third transistor T3 (that is an input terminal of the second current mirror circuit MR2) is connected to a second terminal of the switching component SW and a control terminal of the third transistor T3. A second terminal of the third transistor T3 is grounded. A first terminal of the fourth transistor T4 is connected to an output terminal of the current source AS. An input terminal of the current source AS is coupled to the input voltage VIN. A control terminal of the fourth transistor T4 is connected to the control terminal of the third transistor T3. A second terminal of the fourth transistor T4 is grounded.

The third current mirror circuit MR3 includes a fifth transistor T5 and a sixth transistor T6.

A first terminal of the fifth transistor T5 of the third current mirror circuit MR3 (that is an input terminal of the third current mirror circuit MR3) is connected to the first terminal of the fourth transistor T4 of the second current mirror circuit MR2 (that is an output terminal of the second current mirror circuit MR2) and the output terminal of the current source AS. A second terminal of the fifth transistor T5 of the third current mirror circuit MR3 is grounded. A control terminal of the sixth transistor T6 is connected to the first terminal and a control terminal of the fifth transistor T5. A first terminal of the sixth transistor T6 is connected to a first input terminal such as a non-inverting input terminal of the second operational amplifier OPA2. A second terminal of the sixth transistor T6 is grounded.

If necessary, the current limit controlling circuit ACLT1 of the adaptive current limiting circuit ACL11 of the power switch circuit of the present disclosure may further include a second resistor R2. A first terminal of the second resistor R2 is coupled to the input voltage VIN.

A second terminal of the second resistor R2 is connected to the first terminal of the sixth transistor T6 and the first input terminal such as the non-inverting input terminal of the second operational amplifier OPA2. A second input terminal such as an inverting input terminal of the second operational amplifier OPA2 is connected to the second terminal of the current sensing resistor Rs as shown in FIG. 1 or FIG. 2. The output current IOUT of the power switch circuit of the present disclosure depends on the input voltage VIN, the output voltage VOUT, a resistance of the first resistor R1, a resistance of the second resistor R2, a size ratio of the first current mirror circuit MR1, a size ratio of the second current mirror circuit MR2, a size ratio of the third current mirror circuit MR3 and the current source AS.

A control terminal of the current limit switch TLM is connected to an output terminal of the second operational amplifier OPA2. A first terminal of the current limit switch TLM as shown in FIG. 3 is connected to the control terminal NGA of the power switch SWP as shown in FIG. 1 or FIG. 2. A second terminal of the current limit switch TLM is grounded.

When the load is a light load or is removed, the load only obtains a small amount of power from the output voltage VOUT and the output current IOUT of the power switch circuit of the present disclosure. Under this condition, the current limit controlling circuit ACLT1 may not perform the current limiting operation for limiting the output current IOUT supplied to the load. At this time, in the power switch circuit of the present disclosure, the switching component SW of the current limit adjusting circuit ACLD1 may be in an off state.

It is worth noting that, when the load is a heavy load and overloaded, the load obtains a large amount of power from the output voltage VOUT and the output current IOUT of the power switch circuit of the present disclosure such that the output voltage VOUT of the power switch circuit of the present disclosure is reduced as shown in FIG. 4. A voltage difference between the input voltage VIN received by the first terminal of the power switch SWP and the voltage of the second terminal of the power switch SWP (that is the output voltage VOUT of the power switch circuit) increases. As a result, the substrate current IBULK1 of the power switch SWP increases. Under this condition, in the power switch circuit of the present disclosure, the switching component SW of the current limit adjusting circuit ACLD1 may be switched to an on state. At this time, the current limit controlling circuit ACLT1 performs the current limiting operation.

In the current limiting operation, the current limit controlling circuit ACLT1 controls the power switch SWP to operate for reducing the input current IIN1 flowing through the power switch SWP as shown in FIG. 1 and FIG. 4. For example, as shown in FIG. 4, when the output voltage VOUT of the power switch circuit is reduced to be lower than the limit voltage VB, the input current IIN1 of the power switch SWP is reduced from an initial current value ICL to a current limit value ISC. As a result, the output current IOUT supplied to the load from the power switch circuit of the present disclosure is limited, and the substrate current IBULK1 of the power switch SWP is not larger than a current limit value IBC, thereby preventing a parasitic component of the power switch SWP from being conducted by the large substrate current IBULK1 to cause damage to the power switch SWP.

Figure 5:
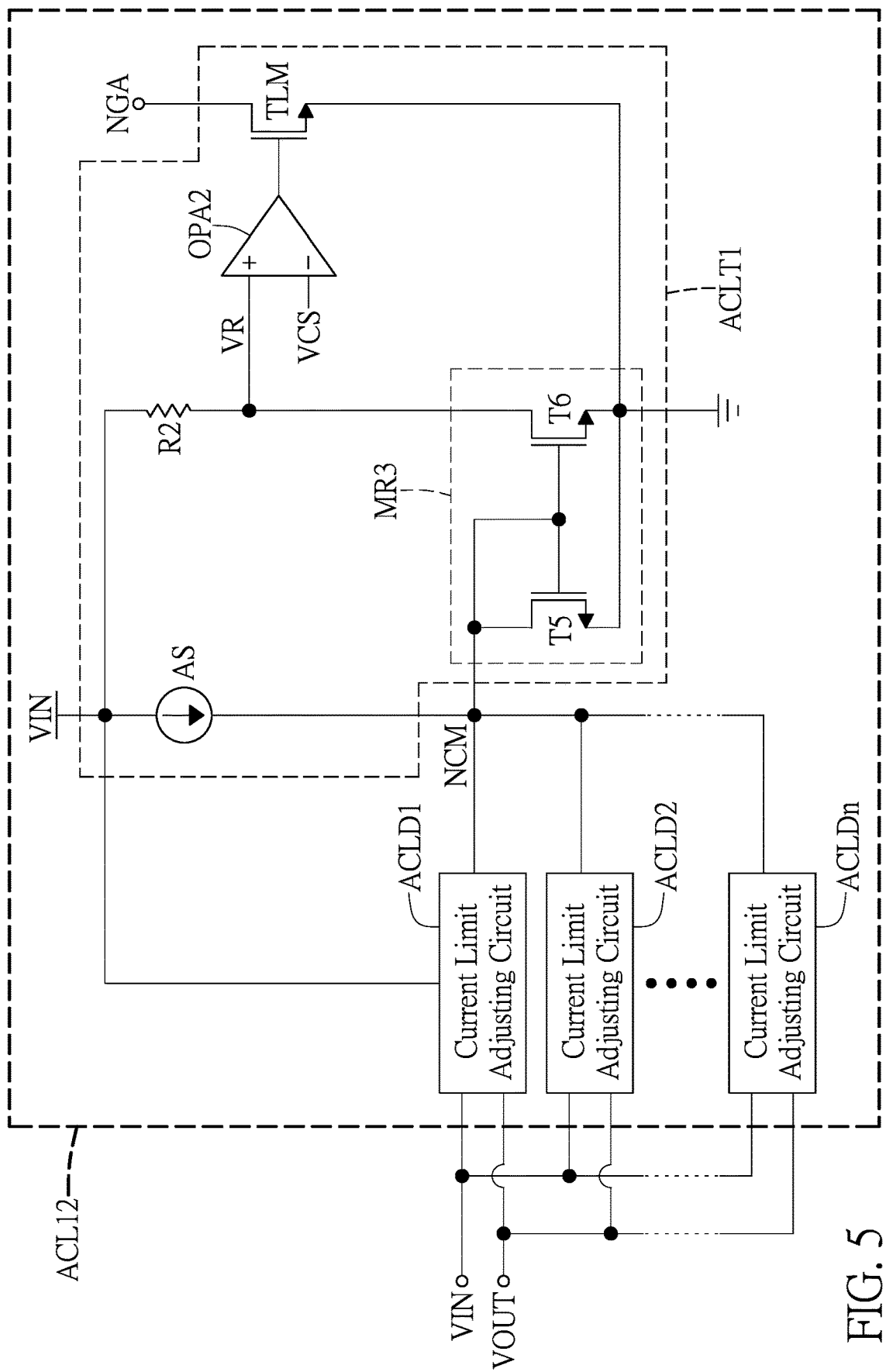
FIG. 5 is a circuit diagram of an adaptive current limiting circuit for performing a multi-stage current limiting operation in a power switch circuit of adaptively limiting a current according to a fourth embodiment of the present disclosure.
Figure 6:
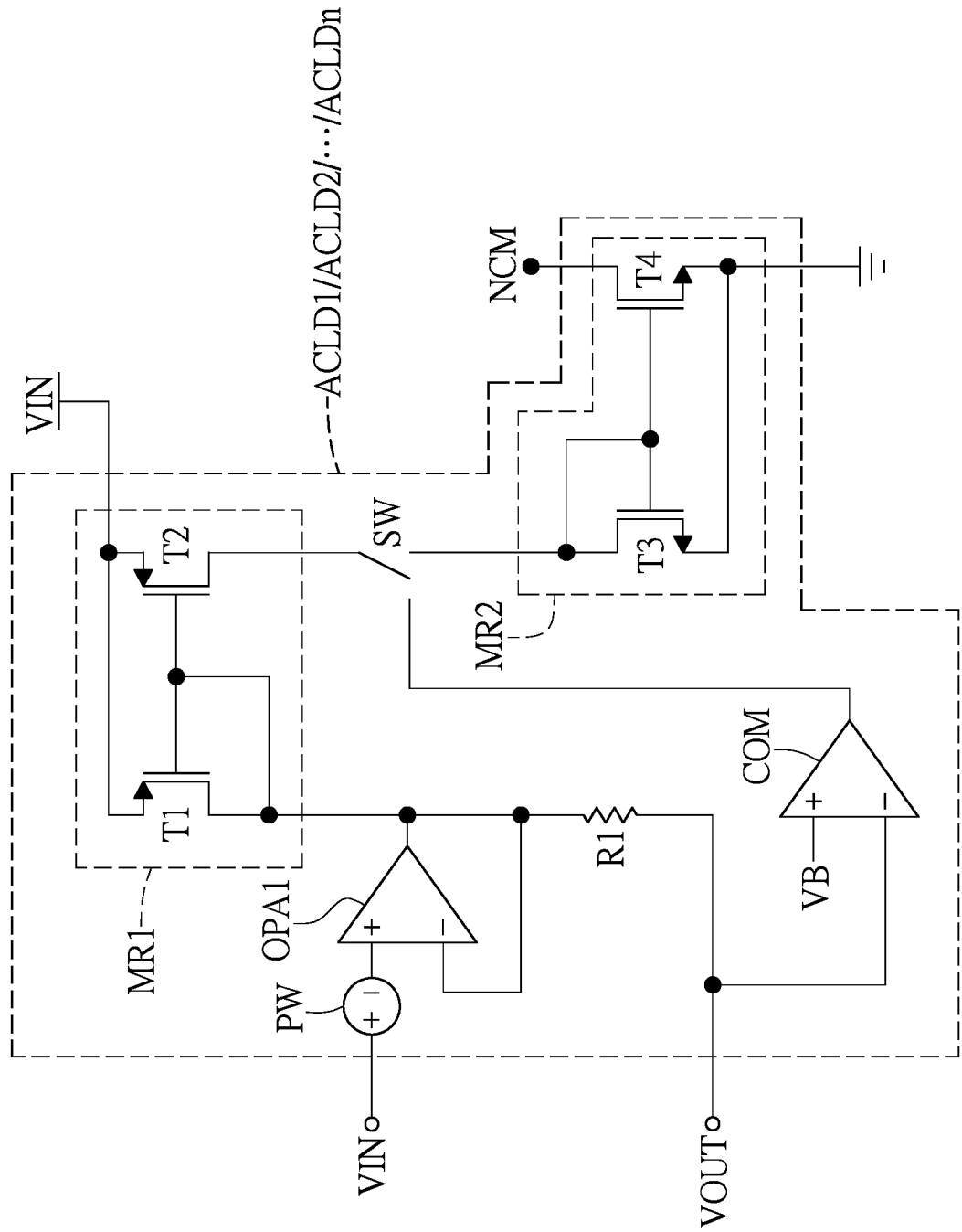
FIG. 6 is a circuit diagram of a current limit adjusting circuit of the adaptive current limiting circuit for performing the multi-stage current limiting operation in the power switch circuit according to the fourth embodiment of the present disclosure.
Figure 7:
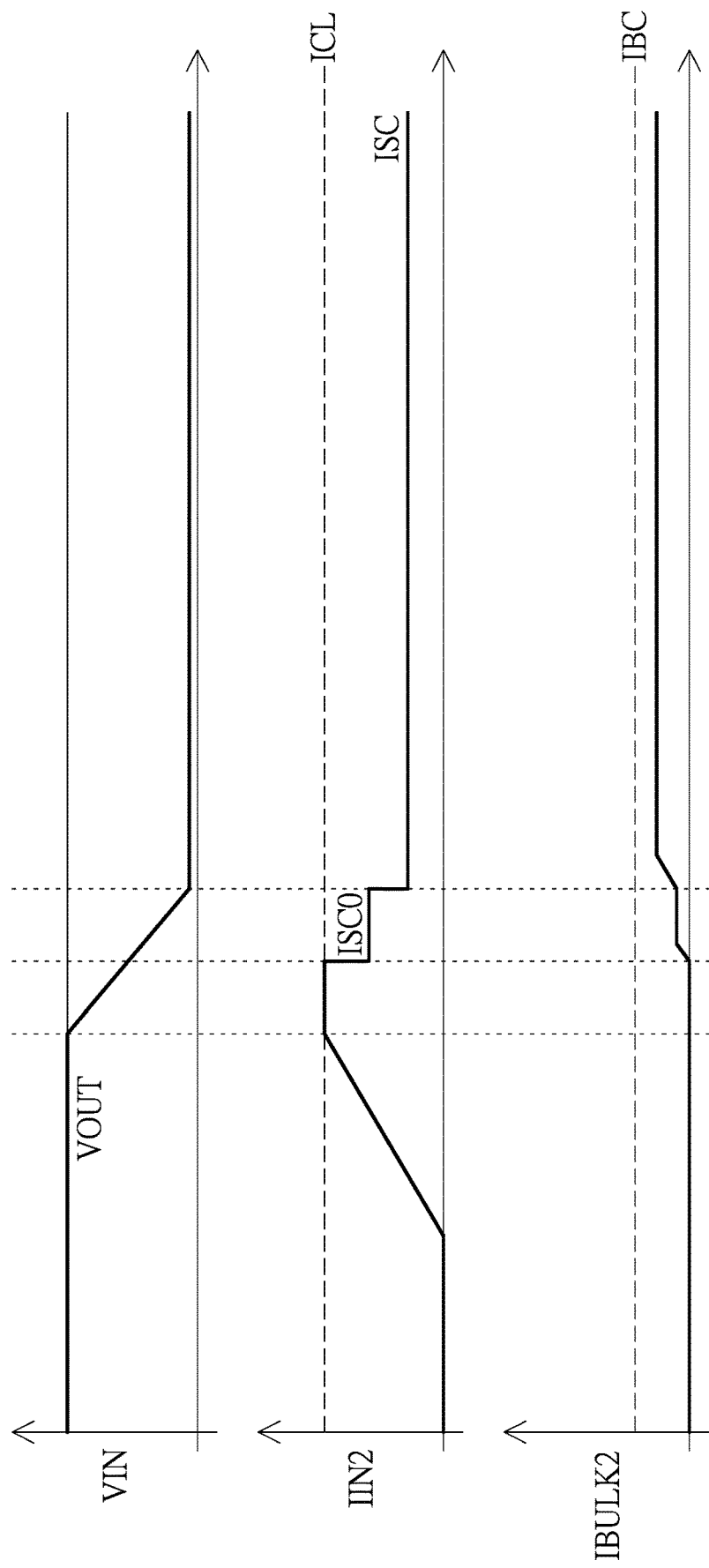
FIG. 7 is a waveform diagram of signals generated when the power switch circuit performs the multi-stage current limiting operation according to the fourth embodiment of the present disclosure.

Reference is made to FIGS. 5 to 7, in which FIG. 5 is a circuit diagram of an adaptive current limiting circuit for performing a multi-stage current limiting operation in a power switch circuit of adaptively limiting a current according to a fourth embodiment of the present disclosure, FIG. 6 is a circuit diagram of a current limit adjusting circuit of the adaptive current limiting circuit for performing the multi-stage current limiting operation in the power switch circuit according to the fourth embodiment of the present disclosure, and FIG. 7 is a waveform diagram of signals generated when the power switch circuit performs the multi-stage current limiting operation according to the fourth embodiment of the present disclosure.

A difference between the fourth and third embodiments of the present disclosure is that, the adaptive current limiting circuit ACL11 of the power switch circuit of the third embodiment of the present disclosure only includes the current limit adjusting circuit ACLD1 as shown in FIG. 3, but an adaptive current limiting circuit ACL12 of the power switch circuit of the fourth embodiment of the present disclosure only includes a plurality of current limit adjusting circuits ACLD1 to ACLDn as shown in FIG. 5.

The configurations and the operations of circuit components of each of the plurality of current limit adjusting circuits ACLD1 to ACLDn that are the same as the configurations and the operations of the current limit adjusting circuit ACLD1 as shown in FIG. 3 are not repeated herein.

In the power switch circuit of the third embodiment of the present disclosure, the current limit adjusting circuit ACLD1 as shown in FIG. 3 performs the single stage current limiting operation. As a result, the input current IIN1 of the power switch SWP is reduced from the initial current value ICL to the current limit value ISC at one time as shown in FIG. 4.

However, in the power switch circuit of the fourth embodiment of the present disclosure, the plurality of current limit adjusting circuits ACLD1 to ACLDn as shown in FIG. 5 perform the multi-stage current limiting operation. In the multi-stage current limiting operation, the input current IIN2 of the power switch SWP is reduced multiple times such that the input current IIN2 of the power switch SWP is reduced from the initial current value ICL to the current limit value ISC as shown in FIG. 7. As a result, the output current IOUT supplied to the load from the power switch circuit of the present disclosure is limited, and the substrate current IBULK1 of the power switch SWP is not larger than the current limit value IBC, thereby preventing the parasitic component of the power switch SWP from being conducted by the large substrate current IBULK1 to cause damage to the power switch SWP.

The circuit components of each of the plurality of current limit adjusting circuits ACLD1 to ACLDn of the adaptive current limiting circuit ACL12 of the power switch circuit of the fourth embodiment of the present disclosure as shown in FIG. 5 are configured as shown in FIG. 6, which is the same as that of the current limit adjusting circuit ACLD1 as shown in FIG. 3.

The plurality of current limit adjusting circuits ACLD1 to ACLDn are connected to the output terminal of the current source AS of the current limit controlling circuit ACLT1 and the first terminal of the fifth transistor T5 of the third current mirror circuit MR3 through a common node NCM.

In conclusion, the present disclosure provides the power switch circuit of adaptively limiting the current. In the power switch circuit of the present disclosure, the adaptive current limiting circuit flexibly determines a current limit value for limiting the current flowing through the power switch based on the input voltage and output voltage of the power switch, rather than using a constant current limit. Therefore, the power switch of the power switch circuit of the present disclosure is prevented from being damaged under any condition, for example, under a condition where there is a low output voltage and a high input voltage, which may cause a short circuit.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power switch circuit for adaptively limiting a current, comprising:
   a current sensing resistor, wherein a first terminal of the current sensing resistor is coupled to an input voltage;
   a power switch, wherein a first terminal of the power switch is connected to a second terminal of the current sensing resistor, a second terminal of the power switch is connected to a first terminal of an output capacitor, a second terminal of the output capacitor is grounded, and a voltage of the first terminal of the output capacitor is an output voltage of the power switch circuit;
   a charge pump connected to a control terminal of the power switch, and configured to supply power to the control terminal of the power switch; and
   an adaptive current limiting circuit coupled to the input voltage, and connected to the first terminal of the output capacitor, the second terminal of the current sensing resistor and the control terminal of the power switch;
   wherein the adaptive current limiting circuit determines whether to output a current limiting signal to the control terminal of the power switch according to the input voltage, a voltage of the second terminal of the current sensing resistor, and a voltage of the first terminal of the output capacitor, and the power switch operates to limit a current flowing through the power switch according to the current limiting signal from the adaptive current limiting circuit.

2. The power switch circuit according to claim 1, further comprising:
   an oscillator circuit connected to the charge pump and configured to output an oscillating signal to the charge pump, wherein the charge pump determines a frequency of supplying power to the control terminal of the power switch according to a frequency of the oscillating signal from the oscillator circuit.

3. The power switch circuit according to claim 1, wherein the adaptive current limiting circuit includes:
   a current limit adjusting circuit coupled to the input voltage and connected to the first terminal of the output capacitor, and configured to detect the input voltage and the voltage of the first terminal of the output capacitor to output a current adjusting signal; and
   a current limit controlling circuit connected to an output terminal of the current limit adjusting circuit, the second terminal of the current sensing resistor and the control terminal of the power switch, and configured to output a current limit controlling signal to the control terminal of the power switch according to a voltage of the current adjusting signal from the current limit adjusting circuit and the voltage of the second terminal of the current sensing resistor.

4. The power switch circuit according to claim 3, wherein the current limit adjusting circuit includes:
   a first operational amplifier, wherein a first input terminal of the first operational amplifier is connected to a voltage source, the voltage source is coupled to the input voltage, and a second input terminal of the first operational amplifier is connected to an output terminal of the first operational amplifier and a first terminal of a first resistor;
   a comparator, wherein a first input terminal of the comparator is coupled to a limit voltage, and a second input terminal of the comparator and a second terminal of the first resistor are connected to the first terminal of the output capacitor;
   a first current mirror circuit, wherein an input terminal of the first current mirror circuit is connected to the output terminal of the first operational amplifier;
   a switching component, wherein a first terminal of the switching component is connected to an output terminal of the first current mirror circuit, and a control terminal of the switching component is connected to an output terminal of the comparator; and
   a second current mirror circuit, wherein an input terminal of the second current mirror circuit is connected to a second terminal of the switching component, and an output terminal of the second current mirror circuit is connected to an input terminal of the current limit controlling circuit.

5. The power switch circuit according to claim 4, wherein the current limit controlling circuit includes:
   a third current mirror circuit, wherein an input terminal of the third current mirror circuit is connected to the output terminal of the second current mirror circuit and an output terminal of a current source, and an input terminal of the third current mirror circuit is coupled to the input voltage;
   a second operational amplifier, wherein a first input terminal of the second operational amplifier is connected to an output terminal of the third current mirror circuit, and a second input terminal of the second operational amplifier is connected to the second terminal of the current sensing resistor; and
   a current limit switch, wherein a control terminal of the current limit switch is connected to an output terminal of the second operational amplifier, a first terminal of the current limit switch is connected to the control terminal of the power switch, and a second terminal of the current limit switch is grounded.

6. The power switch circuit according to claim 5, wherein the first current mirror circuit includes:
   a first transistor, wherein a first terminal of the first transistor is coupled to the input voltage, and a second terminal of the first transistor is connected to the output terminal of the first operational amplifier and a control terminal of the first transistor; and
   a second transistor, wherein a first terminal of the second transistor is coupled to the input voltage, a control terminal of the second transistor is connected to the control terminal of the first transistor, and a second terminal of the second transistor is connected to the first terminal of the switching component.

7. The power switch circuit according to claim 6, wherein the second current mirror circuit includes:
   a third transistor, wherein a first terminal of the third transistor is connected to the second terminal of the switching component and a control terminal of the third transistor, and a second terminal of the third transistor is grounded; and
   a fourth transistor, wherein a first terminal of the fourth transistor is connected to an output terminal of the current source, a control terminal of the fourth transistor is connected to the control terminal of the third transistor, and a second terminal of the fourth transistor is grounded.

8. The power switch circuit according to claim 7, wherein the third current mirror circuit includes:
   a fifth transistor, wherein a first terminal of the fifth transistor is connected to a first terminal of the fourth transistor and the output terminal of the current source, and a second terminal of the fifth transistor is grounded; and
   a sixth transistor, wherein a control terminal of the sixth transistor is connected to a control terminal and the first terminal of the fifth transistor, a first terminal of the sixth transistor is connected to the first input terminal of the second operational amplifier, and a second terminal of the sixth transistor is grounded.

9. The power switch circuit according to claim 8, wherein the current limit controlling circuit further includes:
   a second resistor, wherein a first terminal of the second resistor is coupled to the input voltage, and a second terminal of the second resistor is connected to the first terminal of the sixth transistor and the first input terminal of the second operational amplifier.

10. The power switch circuit according to claim 1, wherein the adaptive current limiting circuit includes:
    a plurality of current limit adjusting circuits, wherein the plurality of current limit adjusting circuits are coupled to the input voltage and connected to the first terminal of the output capacitor, and configured to detect the input voltage and the voltage of the first terminal of the output capacitor, for outputting current adjusting signals, respectively; and
    a current limit controlling circuit connected to an output terminal of each of the plurality of current limit adjusting circuits, the second terminal of the current sensing resistor and the control terminal of the power switch;
    wherein the current limit controlling circuit, according to differences between a plurality of current adjusting signals outputted respectively by the plurality of current limit adjusting circuits and the voltage of the second terminal of the current sensing resistor, outputs a plurality of current limit controlling signals to the control terminal of the power switch in a multi-stage current limiting operation for reducing the current flowing through the power switch multiple times.

11. The power switch circuit according to claim 10, wherein each of the plurality of current limit adjusting circuits includes:
    a first operational amplifier, wherein a first input terminal of the first operational amplifier is connected to a voltage source, the voltage source is coupled to the input voltage, and a second input terminal of the first operational amplifier is connected to an output terminal of the first operational amplifier and a first terminal of a first resistor;
    a comparator, wherein a first input terminal of the comparator is coupled to a limit voltage, and a second input terminal of the comparator and a second terminal of the first resistor are connected to the first terminal of the output capacitor;
    a first current mirror circuit, wherein an input terminal of the first current mirror circuit is connected to the output terminal of the first operational amplifier;
    a switching component, wherein a first terminal of the switching component is connected to an output terminal of the first current mirror circuit, and a control terminal of the switching component is connected to an output terminal of the comparator; and
    a second current mirror circuit, wherein an input terminal of the second current mirror circuit is connected to a second terminal of the switching component, and an output terminal of the second current mirror circuit is connected to an input terminal of the current limit controlling circuit.

12. The power switch circuit according to claim 11, wherein the current limit controlling circuit includes:
    a third current mirror circuit, wherein an input terminal of the third current mirror circuit is connected to the output terminal of the second current mirror circuit and an output terminal of a current source, and an input terminal of the third current mirror circuit is coupled to the input voltage;
    a second operational amplifier, wherein a first input terminal of the second operational amplifier is connected to an output terminal of the third current mirror circuit, and a second input terminal of the second operational amplifier is connected to the second terminal of the current sensing resistor; and a current limit switch, wherein a control terminal of the current limit switch is connected to an output terminal of the second operational amplifier, a first terminal of the current limit switch is connected to the control terminal of the power switch, and a second terminal of the current limit switch is grounded.

13. The power switch circuit according to claim 12, wherein the first current mirror circuit includes:
    a first transistor, wherein a first terminal of the first transistor is coupled to the input voltage, and a second terminal of the first transistor is connected to the output terminal of the first operational amplifier and a control terminal of the first transistor; and
    a second transistor, wherein a first terminal of the second transistor is coupled to the input voltage, a control terminal of the second transistor is connected to the control terminal of the first transistor, and a second terminal of the second transistor is connected to the first terminal of the switching component.

14. The power switch circuit according to claim 13, wherein the second current mirror circuit includes:
    a third transistor, wherein a first terminal of the third transistor is connected to the second terminal of the switching component and a control terminal of the third transistor, and a second terminal of the third transistor is grounded; and
    a fourth transistor, wherein a first terminal of the fourth transistor is connected to an output terminal of the current source, and a control terminal of the fourth transistor is connected to a control terminal of the third transistor, and a second terminal of the fourth transistor is grounded.

15. The power switch circuit according to claim 14, wherein the third current mirror circuit includes:
    a fifth transistor, wherein a first terminal of the fifth transistor is connected to a first terminal of the fourth transistor and the output terminal of the current source, and a second terminal of the fifth transistor is grounded; and
    a sixth transistor, wherein a control terminal of the sixth transistor is connected to a control terminal and the first terminal of the fifth transistor, a first terminal of the sixth transistor is connected to the first input terminal of the second operational amplifier, and a second terminal of the sixth transistor is grounded.

16. The power switch circuit according to claim 15, wherein the current limit controlling circuit further includes:
    a second resistor, wherein a first terminal of the second resistor is coupled to the input voltage, and a second terminal of the second resistor is connected to the first terminal of the sixth transistor and the first input terminal of the second operational amplifier.

\* \* \* \* \*